United States Patent [19]

Preis

[11] Patent Number: 4,778,867

[45] Date of Patent: Oct. 18, 1988

[54] FERROELECTRIC COPOLYMERS OF VINYLIDENE FLUORIDE AND TRIFLUOROETHYLENE WITH INCREASED CURIE TEMPERATURE AND THEIR METHODS OF PRODUCTION

[76] Inventor: Seymour Preis, 943 N. 24th St., Allentown, Pa. 18104

[21] Appl. No.: 75,951

[22] Filed: Jul. 21, 1987

[51] Int. Cl.[4] ............................................. C08F 14/18
[52] U.S. Cl. .................................................... 526/255
[58] Field of Search ......................................... 526/255

[56] References Cited

U.S. PATENT DOCUMENTS

| | | | |
|---|---|---|---|
| 4,173,033 | 10/1979 | Sako et al. | 526/255 |
| 4,241,128 | 12/1980 | Wang | 526/255 |
| 4,268,653 | 5/1981 | Uchidoi et al. | 526/255 |
| 4,308,370 | 12/1981 | Fukada et al. | 526/255 |
| 4,360,652 | 11/1982 | Dohany | 526/210 |
| 4,407,887 | 10/1983 | Hashizume et al. | 526/255 |
| 4,521,322 | 6/1985 | Brousaux et al. | 526/255 |
| 4,578,442 | 3/1986 | Ohigashi et al. | 526/255 |
| 4,668,449 | 5/1987 | Sori et al. | 526/255 |

FOREIGN PATENT DOCUMENTS

| | | | |
|---|---|---|---|
| 6197308 | 5/1986 | Japan | 526/255 |
| 2184737 | 7/1987 | United Kingdom | 526/255 |

OTHER PUBLICATIONS

Hackh's Chemical Dictionary, pp. 49 and 363.
K. Koga et al., Piezoelectricity and Related Properties of Vinylidene Fluoride and Trifluoroethylene Copolymers, Journal of Applied Physics, vol. 59, pp. 2141–2150, 1986.
A. J. Lovinger, Recent Developments in the Structure, Properties and Applications of Ferroelectric Polymers, Japanese Journal of Applied Physics, vol. 24 Supplement, 24–2, pp. 18–22, 1985.
T. Yogi et al., Transition Behavior and Dielectric Properties in Trifluoroethylene and Vinylidene Fluoride Copolymers, Polymer Journal, vol. 12, No. 4, pp. 209–223, 1980.
T. Furukowa et al., Ferroelectric Phase Transition in a Copolymer of Vinylidene Fluoride and Trifluoroethylene, Ferroelectrics, vol. 32, pp. 61–67, 1981.
A. Odajima, A Statistical Theory of Ferroelectric Phase Transition of Vinylidene Fluoride and Trifluoroethylene Copolymers, Ferroelectrics, vol. 57, pp. 159–170, 1984.
K. Toshiro et al., Phase Transition at a Temperature Immediately Below the Melting Point of Poly(Vinyledene Fluoride) Form I: A Proposition for the Ferroelectric Curie Point, Polymer, vol. 24, pp. 199–204, 1983.
A. J. Lovinger et al., Crystallographic Changes Characterizing the Curie Transition in Three Ferroelectric Copolymers of Vinylidene Fluoride and Trifluoroethylene: 2 Oriented or Poled Samples, Polymer, vol. 24, pp. 1233–1239, 1983.
J. S. Green et al., Effect of Thermal and Solution History on the Curie Point of VF2–TrFE Random Copolymers, Journal of Applied Physics, vol. 60, pp. 2690–2693, 1986.
H. Ohigashi et al., Ferroelectric Copolymers of Vinylidene Fluoride and Trifluoroethylene with a Large Electromechanical Coupling Factor, Japanese Journal of Applied Physics, vol. 21, pp. L455–L457, 1982.
K. Kimura et al., Ferroelectric Properties of Poly(-Vinylidene Fluoride-Trifluoroethylene) Copolymers Thin Films, Applied Physics Letters, vol. 43, pp. 834–836, 1983.
Y. Oka et al., Structure and Spontaneous Polarization in Fast Quenched Copolymers of Vinylidene Fluoride and Trifluoroethylene, Polymer Journal, vol. 18, pp. 417–427, 1986.
G. M. Stack et al., Calorimetric and X-ray Studies of the Solid State Transition in Copolymers of Vinylidene Fluoride and Trifluoroethylene, Polymer Preprints, vol. 27, No. 2, pp. 161–161, 1980.
S. Osaki et al., Effects of Annealing and Isothermal Crystallization upon Crystalline Forms of Poly(Vinylidene Fluoride), Journal of Polymer Science, vol. 13, pp. 1071–1083, 1985.

*Primary Examiner*—Joseph L. Schofer
*Assistant Examiner*—N. Sarofim
*Attorney, Agent, or Firm*—John J. Selko

[57] ABSTRACT

A ferroelectric random copolymer consisting essentially of about 65 to 80 mole percent of vinylidene fluoride and 35 to 20 mole percent trifluoroethylene with an increased Curie temperature obtained via a heat-treatment within certain temperature ranges. The heat-treatment can be isothermal or cyclic. The resulting material can be used in nondestructive devices over a wider temperature range than conventional materials.

20 Claims, No Drawings

FERROELECTRIC COPOLYMERS OF VINYLIDENE FLUORIDE AND TRIFLUOROETHYLENE WITH INCREASED CURIE TEMPERATURE AND THEIR METHODS OF PRODUCTION

BACKGROUND OF THE INVENTION

1. Field of the Invention

This invention relates to the heat-treatment of a thermoplastic ferroelectric copolymer of vinylidene fluoride and trifluoroethylene which results in the significant increase in the Curie temperature (heating) of the material, thereby increasing the thermal range over which the material is piezoelectric.

2. General Description of the Prior Art

It is a well known practice to construct transducers for ultrasonic nondestructive inspection devices with piezoelectric materials. It is also well known that random copolymers of vinylidene fluoride and trifluoroethylene, particularly within approximately the mole ratio stated in this invention, are employed and are being developed for use in such devices because of the piezoelectricity of these copolymers. These copolymers can also be used in pyroelectric sensors and devices. Such random copolymers are provided as random semicrystalline copolymers which can be shaped or formed into semicrystalline, essentially unoriented and unstretched, thermoplastic film or sheet or tubular-constructed product via such well known processing methods as extrusion, injection molding, compression molding and solvent casting. The materials so provided within the the approximate mole ratios of this invention contain, under ambient conditions, essentially a single crystalline phase whose structure is the ferroelectric all-trans chain conformation referred to in the prior art and herein as the Form-I or the $\beta$-phase. The piezoelectric and thermal properties of the $\beta$-phase are essentially the same as described in the article by K. Koga and H. Ohigashi, J. Appl. Phys., 59, (6), 2142, (1986). The $\beta$-phase polar structure of the crystalline lattice confers significant piezoelectric properties on the copolymers after such copolymers have been electrically polarized.

As is well known, the term piezoelectric means the ability of a material to exchange electrical for mechanical energy and vice versa and the electromechanical response is believed to be essentially associated with dimensional changes during deformation or pressure oscillation. It is further known that these copolymers possess high electromechanical coupling factors (about 30%) that render them particularly useful for ultrasonic transducers (A. J. Lovinger, Japanese J. Appl. Phys., 24, Supplement 24-2, 18, (1985)).

The piezoelectric characteristic of such copolymer material exists when the material is in the ferroelectric state and, conversely, such piezoelectric characteristic does not exist to a commercially usable degree when the material is in the paraelectric state. It is well known that the copolymers of this invention undergo, upon heating, a first order Curie transition which effects a crystalline phase change from the $\beta$-phase polar ferroelectric state to the nonpolar paraelectric state (T. Yagi, M. Tatemoto, J. Sako, Polymer J., 22, 209, (1980), and also T. Furukawa, G. E. Johnson, H. E. Bair, Y. Tajitsu, A. Chiba, E. Fukada, Ferroelectrics, 32, 61, (1981)). The Curie transition for these copolymers is well characterized, upon heating, by an endotherm which exhibits a temperature peak called the Curie temperature. Heating through the Curie transition will cause a copolymer which has been polarized, and is therefore highly piezoactive, to become depolarized, and therefore piezoinactive. It is well known to measure the phase change and the Curie temperature by a technique referred to in the prior art as differential scanning calorimetry, referred to herein as DSC.

When the paraelectric phase is cooled, the Curie transition is reversed and the ferroelectric phase is formed or reformed, as the case may be, accompanied by a characteristic exotherm and Curie temperature peak. The Curie temperature peak on cooling is lower than the Curie temperature peak on heating due to hysteresis, as is well known, and the difference may be as much as 50 degrees C. (A. Odajima, Ferroelectrics, 57, 159, (1984)).

As used herein, the term "Curie temperature (heating)" refers to the temperature peak on the endotherm, as determined by differential scanning calorimetry, DSC, measured during heating through the ferroelectric to paraelectric transition. As used herein, the term "Curie temperature (cooling)" refers to the temperature peak on the exotherm, as determined by differential scanning calorimetry, DSC, measured during cooling through the paraelectric to ferroelectric transition.

It is further well known that the endothermic Curie temperature (heating) increases as the mole ratio of vinylidene fluoride in the copolymers increases, being approximately 70 degrees C. at 65 mole percent vinylidene fluoride and approximately 130 degrees C. at 80 mole percent vinylidene fluoride, while the crystalline melting temperature of approximately 150 degrees C. remains relatively unchanged within a few degrees (K. Tashiro, K. Takano, M. Kobayashi, Y. Chatani, H. Tododoro, Polymer, 24, 199, (1983), A. J. Lovinger, T. Furukawa, G. T. Davis, M. G. Broadhurst, Ibid., 1233).

A problem with the copolymers of the prior art is that the Curie temperature (heating) of such copolymers is too low, thereby limiting the temperature range over which the material can be used and stored. The problem is obviously more acute with the copolymers of this invention which have the lower mole ratio vinylidene fluoride—and therefore a lower Curie temperature (heating)—where even a minimal potential increase is desirable. In addition, in the course of manufacture and assembly of piezoelectric derivative devices, it is often advantageous to expose assembly to a curing, sealing, soldering, electroding, etc. processing procedure whose heat generation may be sufficient to effect a depolarization of the copolymer with loss of piezoelectric activity. Further, it has been pointed out that from a device standpoint it would be attractive to be able to tailor the Curie temperature (heating) over a range of temperatures without requiring preparation of an increasing number of mole ratio compositions, (J. Green, B. L. Farmer, J. F. Rabolt, J. Appl. Phys., 60, 2690. (1986).

There is a need, therefore, for a copolymer material of the type described herein, which material has a significantly elevated Curie temperature (heating), thereby providing piezoelectric activity over a wider temperature range. There is a need, also, for a method for producing such material. The invention described herein provides a material and a method which satisfies these needs.

Prior art teaches that, for the polymer shaping methods, such as extrusion, injection, quench cooling of compression molded pieces or other methods for which rapid cooling is a final step, for one to obtain substantive piezoactivity, it is necessary and desirable to anneal the above produced materials for a short time. (H. Ohigashi, K. Koga, Japanese J. Appl. Phys., 21, L455–L457, (1982). Current art elaborates more fully on the useful application of such short-time annealing which is applied at a temperature (essentially 140 degrees C.) which is above the temperature region which coincides with the region in which its ferroelectric to paraelectric (Curie) transition occurs, but below the crystalline melting point. (K. Kimura, H. Ohigashi, Appl. Phys. Lett., 43, 834, (1983); U.S. Pat. No. 4,578,442 to H. Ohigashi et al.

One effect of such annealing is to reduce the Curie temperature (heating). Thus, K. Koga, H. Ohigashi, (Op. cit. (1986), report that the 74 mole percent vinylidene copolymer obtained by ice quenching from the melt had a Curie temperature (heating) of 129 degrees C., while after the annealing treatment the Curie temperature (heating) is 123 degrees C. An additional citation which shows that the above type of short-time annealing produces a reduction in Curie temperature (heating) is offered by Y. Oka, Y. Murata, N. Koizumi, Polymer J., 18, 417, (1986)). The random copolymer therein of 65 mole percent vinylidene fluoride and 35 mole percent trifluoroethylene showed that annealing at 120 degrees or 140 degrees C. for up to about one day reduced the Curie temperature (heating) over that obtained by fast quenching methods.

Similarly, the effect of such annealing is given by J. S. Green, B. L. Farmer, J. G. Rabolt (Op. cit.) Their data refers to a 60 mole percent vinylidene fluoride copolymer, a composition at the limits of that covered by this invention. In addition, processes that use a slow cooling rate from the melt temperature of the copolymer (as opposed to the rapid cooling processes mentioned above) also lower the Curie temperature (heating). In other words, the slow cooling is similar in effect to a rapid cooling followed by an anneal, as described above. (G. M. Stack, R. Y. Ting, Polymer Preprints, 27, (2) 161, (September 1986), Y. Oka, Y. Murata, N. Koizuma, (Op. cit.)).

As indicated above, the Curie temperature (heating) of each composition is influenced by its immediate prior heat-treatment. It is well known that the highest temperature peak in the DSC heating thermogram is associated with the melting point of the paraelectric phase, with the Curie temperature (heating) being the nearest peak to, and on the low temperature side, of the melting point peak. In order to obtain a reference value of Curie temperature (heating) for comparison purposes, it is useful to provide a thermal history which is the same for every sample. As used herein the term "constant thermal history" means the following procedure to establish a standard Curie temperature (heating) reference and a standard Curie temperature (cooling) reference value: Heating a sample at a rate of 10 degrees C./min. while recording the DSC thermogram curve generated; continuing the heating until the curve passes through the melting peak at approximately 150 degrees C.; continuing the heating at the same rate until the melt reaches 210 degrees C.; maintaining the melt at 210 degrees C. for 10 minutes; then, cooling at 10 degrees C./min., passing through the crystallization temperature exotherm and the paraelectric to ferroelectric transition exotherm; cooling 17 degrees C.; and finally reheating the sample to 210 degrees C. at 10 degrees C./min. through the ferroelectric to paraelectric Curie transition and paraelectric crystalline melting point transition.

The DSC heating curve recorded on the *second* heating indicates a reference Curie temperature (heating). As used herein the term "reference Curie temperature (heating)" means the Curie temperature (heating) as determined on a sample subject to the "constant thermal history" as defined hereinabove. The "reference Curie temperature (heating)" has an associated ferroelectric to paraelectric phase transition. Therefore, as used herein, the term "critical temperature range" means the temperature range within which the "reference Curie temperature (heating)" occurs and within which its associated ferroelectric to paraelectric phase transition occurs.

The DSC cooling curve recorded on the first cooling indicates a reference Curie temperature (cooling). As used herein, the term "reference Curie temperature (cooling)" means the Curie temperature (cooling) as determined on a sample subject to the "constant thermal history" as defined hereinabove. These reference Curie temperatures (heating) and (cooling) are within a few degrees of the Curie temperatures (heating) and (cooling) obtained by the annealing processes of the prior art described above, and therefore can be taken to represent the Curie temperatures (heating) and (cooling) of samples as if such samples were treated in accordance with the teachings of such prior and current art.

Another aspect of the current art teaches that short-time annealing of a poled sample at its Curie temperature (heating) causes the Curie temperature (heating) endotherm to separate into two peaks. One broader peak is below the original Curie temperature (heating) of the sample, and one sharper peak is above the original Curie temperature (heating) of the sample. The lower peak represents depolarized material and the upper peak represents the remaining polarized material. This dual peak occurrence is consistent with prior art teaching that, for an unpoled sample, its ferroelectric to paraelectric transition region is broader, and its associated Curie temperature (heating) is lower, than the transition region and Curie temperature heating) is on the originally poled sample, from which the unpoled sample is derived. This formation of dual peaks was only observed down to 8 degrees C. below the Curie temperature (heating) of the original sample.

SUMMARY OF THE INVENTION

I have discovered that I can provide a semicrystalline thermoplastic random copolymer consisting essentially of 65 to 80 mole percent of vinylidene fluoride and 35 to 20 mole percent of trifluoroethylene characterized by a significantly elevated Curie temperature (heating), as a result of the heat-treatment of this invention. The copolymeric material is provided, in the first instance, as a film, sheet or tubular-form product in a nonoriented, nonstretched condition. Such material at ambient conditions is ferroelectric. In one embodiment of this invention, for unpoled material, the Curie temperature (heating) of such lmaterial is elevated by an isothermal heat-treatment for at least 72 hours at a temperature within the critical temperature range as defined herein. Such isothermal heat-treatment can extend for up to 336 hours. The isothermal heat-treatment elevates the Curie temperature (heating) above a quench cooled sample's Curie temperature (heating), and can elevate the Curie temperature (heating) up to the melting point of the material, depending upon the starting analysis of the material, thus providing a range of materials with a piezoelectric characteristic extending from below ambient temperature up to the melting point range of the materials of this invention.

In a second embodiment of this invention, for poled material, the Curie temperature (heating) is elevated by an isothermal heat-treatment for at least 72 hours at a temperature about 13 to 17 degrees C. below its initial Curie temperature (heating). Such isothermal heat-treatment can extend up to 336 hours. The isothermal heat-treatment elevates the Curie temperature (heating) in addition to the increase thereof caused by poling.

In a third embodiment of this invention, for unpoled materials, the Curie temperature (heating) of such material is elevated by a cyclic heat-treatment extending for a period between 72 and 240 hours, in which individual cycles of about 12 hours duration are used, and the temperatures of heat-treatment are continuously cycled at a constant rate to temperature limits which are alternately above the reference Curie temperature (heating) but within the critical temperature range, and below the reference Curie temperature (cooling), as such temperatures are defined herein. In other words, the higher heat-treatment temperature upper limit is above the reference Curie temperature (heating) as indicated by a peak on the DSC heating curve (the endothermic peak) for a sample subject to the constant thermal history, as defined herein, and within the associated critical temperature range. The lower heat-treatment temperature lower limit is below the reference Curie temperature (cooling) as indicated by a peak on the DSC cooling curve (the exothermic peak) for a sample subject to the constant thermal history.

The cyclic heat-treatment can elevate the Curie temperature (heating) up to the melting point of the material, depending upon the starting analysis of the material, providing a material with a piezoelectric characteristic extending from below ambient temperature up to the melting point range of the materials of this invention.

For these embodiments, unpolarized films or sheets of the copolymer, after receiving the treatment of this invention, can be conventionally polarized by standard methods, either in room temperature environments or up to the Curie transition range of the resin from which the films or sheet has been fabricated, but maintaining the field while cooling. Room temperature environments are preferred.

In a typical room temperature procedure, a monopolar field is cycled between zero and a maximum amplitude of approximately 100 V/$\mu$m of sheet or film thickness. Each cycle lasts for several seconds to several minutes, the field increasing and decreasing at a constant rate with the maximum level being reached stepwise, and the procedure requiring two or three maximum level cycles. The films or sheets may be polarized before or after the heat-treatment of this invention.

The instrument used to provide the DSC was a DuPont 1090 Thermal Aanalyzer. The sample sizes were about 6-8 mg. All temperature rate changes were recorded at 10 degrees C./min.

The copolymer resins of this invention are prepared by any convenient procedure, including, for example suspension or emulsion polymerization techniques well known in the art. A preferred method is in accordance with the emulsion procedure of U.S. Pat. No. 4,360,652 to J. E. Dohany to yield a copolymer of random composition. Monomers, in the required molar proportions were continuously fed into the reactor along with the appropriate amounts of chain transfer agent and initiator. Each monomer's pressure was maintained constant throughout the reaction at the appropriate temperature. Upon completion of the reaction (effective initiator depletion) the reactor contents were cooled and the copolymer latex product was recovered as a powder by well known means. Such powder can be pelletized by conventional means.

DETAILED DESCRIPTION OF PREFERRED EMBODIMENT

The preferred embodiments of this invention are disclosed in the data listed in the examples below:

EXAMPLE 1

Powdered resins of emulsion polymerized random copolymer compositions of 68 mole percent vinylidene fluoride and 32 percent trifluoroethylene and of 70 mole percent vinylidene fluoride and 30 mole percent trifluoroethylene were press molded into preproportioned, essentially preweighed slugs, which slugs were then each compression molded into 400 $\mu$m sheets. For all samples, a reference Curie temperature (heating) value was determined. A portion of each of the sheets of the two compositions were poled as described above. DSC thermograms were recorded for the reference Curie temperature (heating, the associated endothermic curve and the crystalline phase melting point for the two compositions. A portion of each sheet of the two compositiomns were poled as described above and the Curie temperatures (heating), their associated endothermic curves and the crystalline melting points were also determined by DSC. Four samples, the two poled and portions of the two unpoled sheets from the two compositions were heat-treated isothermally at 95 degrees C. for 21 days. As used herein, the term "day" means 24 hours. For the unpolarized samples, the heat-treatment temperature was below the reference Curie temperature (heating) and within the critical temperature range. For the polarized samples, the heat-treatment temperatures were 13 and 17 degrees C. below the Curie temperature (heating) of the polarized samples, as measured by DSC in the samples before the heat-treatment of this invention.

For comparison, subportions of the poled and unpoled sheets of the two compositions were maintained at ambient conditions during the test period. For unpolarized samples, the heat-treatment temperature was below the reference Curie temperature (heating) and within the critical temperature range. For polarized samples, the heat-treatment temperatures were 13 and 17 degrees C. below the Curie temperature (heating) of the polarized samples, as measured by DSC on such samples before the heat-treatment of this invention, and below the depolarization temperature, so as to avoid depolarization of the samples. The depolarization temperature, as is well known, can be determined from a DSC curve prepared for the polarized material. Such curve, as is well known, exhibits a peak within a phase transition range. The upper limit of the depolarization temperature is below the temperature at which the peak occurs, preferably at the point on the curve immediately before the curve begins to show an absorption of excess heat, i.e. begins to rise to form the peak. Typically, this point is about 15 degrees C. below the peak.

In other words, comparison of the critical temperature range, as displayed by its DSC thermogram, with that of Curie temperature (heating) thermogram of the poled samples (before heat-treatment) identifies a subregion for such poled samples, within which the isothermal treatment should be performed. This subregion has as its upper limit the approximate temperature at which the DSC thermogram begins to rise steeply. Typically, this upper limit is between 8 and 15 degrees C. below the Curie temperature (heating) of the poled sample (before heat-treatment).

The Curie temperatures (heating) and the melting points were measured using differential scanning calorimetry (DSC) heating thermograms. For the nonheated, unpoled samples, the reference Curie temperatures (heating) are used for comparison purposes. For poled samples, only Curie temperatures (heating) were used. The data are given in Table 1:

TABLE 1.

| | Heat-treatment: 21 days at 96 Degrees C. | | | |
|---|---|---|---|---|
| Number | Sample-Description | Time-Days | Curie Temp (heating)-Degrees C. | Melting-Temp.-Degrees C. |
| (Composition analysis: 70/30 mole ratio VDF/TrFE) | | | | |
| 1 | nonheated, unpoled | 0 | 106 | 148 |
|  | heated, unpoled | 21 | 80* 113* | 148 |
| 2 | nonheated, poled | 0 | 112 | 148 |
|  | heated, poled | 21 | 120 | 148 |
| (Composition analysis: 68/32 mole ratio VDF/TrFE) | | | | |
| 3 | nonheated, unpoled | 0 | 100 | 148 |
|  | heated, unpoled | 21 | 87* 113* | 149 |
| 4 | nonheated, poled | 0 | 108 | 148 |
|  | heated, poled | 21 | 112 | 149 |

*This represents a double peak on the DSC endothermic curve, indicative of a major portion of the crystalline transformation from ferroelectric to paraelectric taking place at the higher temperature.

As Table 1 indicates, the heat-treated unpoled samples for both compositions had an increase in their Curie temperature (heating). Table 1 also shows the well known fact that for both compositions the Curie temperature (heating) of the poled samples before heat-treatment is above the reference Curie temperature (heating), but less than the increase that occurs as a result of heat-treatment of unpoled samples. The Table also shows that, upon heat-treatment of the poled samples, the Curie temperature (heating) is further increased to essentially the same level as of and/or exceeds the Curie temperature (heating) of the heat-treated unpoled samples (without substantive loss of polarization). In addition, the heat-treatment of the poled samples did not produce a double peak on the DSC endotherm, while heat-treatment of the unpoled samples did produce such a double peak.

Without wishing to be bound by the following, it is suggested that the heat-treatment of this invention involves a crystal perfection disorder-order conversion of the beta-phase. The lower peak which occurs in several of the unpoled samples is associated with the initial smaller crystallites containing excess crystalline defects, stereoirregular and branched structures and possible contaminants, all of which can contribute to a slower rate of conversion. In regard to the single increased peak of the poled samples, the poling process itself involves a similar crystalline change process, which proceeds at a much faster rate and, therefore, is much less rate discriminating between the larger and the smaller crystallites. Therefore, the heat-treatment applied to the poled samples continues the conversion initiated by poling because much of the material is already well along in its conversion by poling.

EXAMPLE 2

Samples of extruded film of copolymer composition of 80 mole percent vinylidene fluoride and 20 mole percent trifluoroethylene were isothermally heat-treated at 130 degrees C. for varying lengths of times. The samples were unpoled, and the heat-treatment temperature was within the critical temperature range and above the reference Curie temperature (heating) of the starting material, which reference Curie temperature (heating) was measured on a sample subject to the constant thermal history. The results are shown in Table 2:

TABLE 2.

| | Heat-treatment: isothermal (130 degrees C.) | | | |
|---|---|---|---|---|
| Number | Sample-Description | Time-Days | Curie Temp. (heating) Degrees C. | Melting-Temp.-Degrees C. |
| (Composition analysis: 80/20 mole ratio VDF2/TrFE) | | | | |
| 13 | a. control | 0 | 129 | 146 |
|  | b. heated | 3 | 137 | 146 |
|  | c. heated | 5 | 138 | 146 |
|  | d. heated | 7 | 139 | 146 |
|  | e. heated | 10 | ** | ** |
|  | f. heated | 12 | ** | ** |
|  | g. heated | 14 | ** | ** |

**Curie temperature indistinguishable from melting temperature of the DSC thermogram.

As indicated by Table 2., the Curie temperature (heating) of the unpoled heat-treated samples was significantly elevated up to the point that it was indistinguishable from the melting temperature, beginning with isothermal heat-treatment times over 7 days. Between 3 and 7 days, the Curie temperature (heating) was elevated to a smaller, but unexpected, value.

EXAMPLE 3

Sheets were prepared from a copolymer resin with a composition of 80 mole percent vinylidene fluoride and 20 mole percent trifluoroethylene as set forth in Example 1. Samples of each were subjected to continuous, constant-rate cyclic heat-treatment having individual cycles of about 12 hours at a temperature which moves, alternately, between 57 degrees C. to 137 degrees C. and back to 57 degrees C., and so on for various lengths of time. The lower cycling temperature limit of 57 degrees C. is below the reference Curie temperature (cooling) as measured on a sample subject to a constant thermal history. The upper cycling temperature limit of 137 degrees C. is above the reference Curie temperature (heating) as measured on a sample subject to a constant thermal history, but within the critical temperature range. The reason for selecting the temperatures above and below the reference Curie temperature (heating) and reference Curie temperature (cooling), respectively, is to straddle the range over which Curie temperature varies upon heating and cooling due to hysteresis. For all control samples, reference Curie temperatures (heating) were used. Table 3 shows the results:

TABLE 3

Heat-treatment: cyclic at 12 hrs./cycle-
57 degrees C. to 137 degrees C. to 57 degrees C.

| Sample Number | Sample-Description | Time-Days | Curie Temp (heating) Degrees C. | Melting-Temp.-Degrees C. |
|---|---|---|---|---|
| (Composition analysis: 80/20 mole ratio VDF2/TrFE) | | | | |
| 5 | control | 0 | 126 | 147 |
|   | heated | 7 | 138* | 147 |
|   |        |   | 147* |     |
| 6 | control | 0 | 126 | 148 |
|   | heated | 7 | 137* | 148 |
|   |        |   | 148* |     |
| 7 | control | 0 | 126 | 147 |
|   | heated | 8 | 112 | 140* |
|   |        |   |     | 148* |
| 11 | control | 0 | 130 | 149 |
|   | heated | 8 | 112* | 146 |
|   |        |   | 141* |     |
| 8 | control | 0 | 126 | 147 |
|   | heated | 9 | 136 | 148 |
| 9 | control | 0 | 126 | 147 |
|   | a. heated | 6 | 114* | 147 |
|   |           |   | 139* |     |
|   | b. heated | 6 | 114* | 148 |
|   |           |   | 140* |     |
|   | c. heated | 6 | 114* | 148 |
|   |           |   | 140  |     |
| 12 | control | 6 | 128 | 148 |
|   | a. heated | 6 | 112* | 143 |
|   |           |   | 143* |     |
|   | b. heated | 6 | 111* | 143 |
|   |           |   | 143* |     |
| 10 | control | 0 | 126 | 147 |
|   | heated | 1 | 132 | 148 |
|   | heated | 5 | 134 | 147 |
|   | heated | 8 | 123* | 149 |
|   |        |   | 137* |     |
|   | heated | 9 | 123* | 148 |
|   |        |   | 135* |     |
|   | heated | 10 | 124* | 149 |
|   |        |    | 136* |     |

*As can be seen from Table 3., the cyclic heat-treatment elevated the Curie temperature (heating) of the material from that of the beginning material.

Several samples showed the double indication on the DSC test, indicating the the majority of the material exhibited a Curie transformation at the upper temperature that blends in to a large extent with the occurrence of melting. Sample 7 (8 days) showed an unexplained decrease in Curie temperature (heating), and it is believed that the results are anomalous, resulting from error in technique of making the DSC, or from a batch of resin which was contaminated, or from variations in sheet fabrication techniques. A second sample, sample 11 (8 days), of a different batch of resin showed beneficial results similar to the other resins, offsetting sample 7.

The process of this invention can elevate the Curie temperature of either poled or unpoled copolymers of the compositions described. Poling can take place either before or after the heat-treatment of this invention.

I claim:

1. A heat-treated polymeric material consisting essentially of a random-copolymer consisting essentially of 65 to 80 mole percent of vinylidene fluoride and 35 to 20 mole percent of trifluoroethylene, said copolymer having a critical temperature range and a reference Curie Temperature (heating) characterized by a significantly elevated Curie temperature (heating), as a result of heat-treatment for at least 72 hours at a temperature within the critical range and above the reference Curie temperature (heating) of the copolymer.

2. The invention of claim 1 in which the heat-treatment extends continuously for a period of between 72 and 336 hours.

3. The invention of claim 2 in which the heat-treatment temperature is about 130 degrees C. and the reference Curie temperature (heating) of the copolymer is about 129 degrees C.

4. The invention of claim 3 in which the Curie temperature (heating) after heat-treatment is between 137 degrees C. and the melting point of the copolymer.

5. The invention of claim 1 in which the polymeric material is unpolarized and heat-treatment is isothermal for at least 504 hours at a temperature below the reference Curie temperature (heating) of the copolymer, and within the critical temperature range of the copolymer.

6. The invention of claim 1 in which the polymeric material is polarized and the heat-treatment is isothermal for at least 504 hours at a temperature below the reference Curie temperature (heating) of the copolymer, and within the critical temperature range of the copolymer.

7. The invention of claim 5 in which the heat-treatment temperature is about 95 degrees C.

8. The invention of claim 6 in which the heat-treatment temperature is about 95 degrees C.

9. The invention of claim 6 in which the polymeric material is polarized by an electrical field before heat-treatment.

10. The invention of claim 1 in which the polymeric material is polarized by an electrical field after heat-treatment.

11. The invention of claim 1 in which the heat-treatment is cyclic, having individual cycles of about 12 hours at a temperature which moves alternately to an upper limit above the reference Curie temperature (heating) and within the critical temperature range and to a lower limit below the reference Curie temperature (cooling) of the copolymer.

12. The invention of claim 11 in which the total heat-treatment cycle lasts for a period of between 72 and 240 hours.

13. The invention of claim 12 in which the reference Curie temperature (heating) of the copolymer is in the range of 126 to 130 degrees C. and the reference Curie temperature (cooling) is about 75 degrees C., with the heat-treatment temperature upper and lower limits being 137 and 57 degrees C. respectively.

14. A method of significantly elevating by heat-treatment the Curie temperature (heating) of a polymeric material consisting essentially of a random copolymer consisting essentially of 65 to 80 mole percent of vinylidene fluoride and 35 to 20 mole percent trifluoroethylene, said copolymer having a critical temperature range and a reference Curie Temperature (heating) comprising:
   a. providing the polymeric material in the form of a sheet, film or slug; and
   b. determining said reference Curie temperature (heating) of said copolymer; and
   c. isothermally heat-treating the material for at least 72 hours at a temperature within the critical temperature range and above the reference Curie temperature (heating) of the copolymer.

15. The invention of claim 14 in which the heat-treating period lasts continuously for a period of between 72 and 336 hours.

16. The invention of claim 15 in which the heat-treatment temperature is about 130 degrees C. and the reference Curie temperature (heating) is about 129 degrees C.

17. The invention of claim 16 further including the step of polarizing the material in an electrical field after heat-treatment.

18. A method of significantly elevating by heat-treatment the Curie temperature (heating) of a polymeric material consisting essentially of a random copolymer consisting essentially of 65 to 80 mole percent of vinylidene fluoride and 35 to 20 mole percent trifluoroethylene, said copolymer having a critical temperature range, a reference Curie temperature (heating) and a reference Curie temperature (cooling) comprising:

a. providing the polymeric material in the form of a sheet, film or slug; and b. determining said reference Curie temperature (heating) and said reference Curie temperature (cooling); and c. cyclically heat-treating the material in individual periods of about 12 hours at a temperature which moves alternately to an upper limit above the reference Curie temperature (heating) and within the critical temperature range and to a lower limit below the reference Curie temperature (cooling) of the copolymer.

19. The invention of claim 18 in which the total heat-treatment time is between 72 and 240 hours.

20. The invention of claim 19 in which the reference Curie temperature (heating) of the copolymer is in the range of 126 to 130 degrees C. and the reference Curie temperature (cooling) is about 75 degrees C., with the heat-treating temperature upper and lower limits being 137 and 57 degrees respectively.

* * * * *